United States Patent [19]

Vinn et al.

[11] Patent Number: 4,646,114
[45] Date of Patent: Feb. 24, 1987

[54] INTEGRATED CIRCUIT ZENER DIODE

[75] Inventors: Charles L. Vinn, Milpitas; David J. Harris, San Jose, both of Calif.

[73] Assignee: Raytheon Company, Lexington, Mass.

[21] Appl. No.: 687,894

[22] Filed: Dec. 31, 1984

[51] Int. Cl.⁴ .................................. H01L 29/90
[52] U.S. Cl. .................................. 357/13; 357/20
[58] Field of Search ............................. 357/13, 20

[56] References Cited

U.S. PATENT DOCUMENTS

| | | | |
|---|---|---|---|
| 3,403,306 | 9/1968 | Haitz et al. | 357/20 |
| 4,079,402 | 3/1978 | Dunkley et al. | 357/13 |
| 4,136,349 | 1/1979 | Tsang | 357/13 |
| 4,224,631 | 9/1980 | Vickery et al. | 357/13 |
| 4,313,083 | 1/1982 | Gilbert et al. | 323/350 |
| 4,315,209 | 2/1982 | Schmoock | 323/313 |
| 4,441,114 | 4/1984 | Muggli | 357/13 |

OTHER PUBLICATIONS

"Monolithic-Temperature Stabilized Voltage Reference with 0.5 ppm/C Drift" by Robert C. Dobkins, 1966, IEEE International Solid State Circuits Conference, pp. 108-109.
"A Five-Terminal +15-V Monolithic Voltage Regulator" by William F. Davis, IEEE Journal of Solid State Circuits, vol. SC-6, Dec. 1971, pp. 366-376.
"An Ion-Implanted Subsurface Monolithic Zener Diode" by Sik Lui, Robert G. Meyer and Norman Kwan, IEEE Journal of Solid-State Circuits, vol. SC-14, No. 4, Aug. 1979, pp. 782-784.
M. Timko et al., "Circuit Techniques for Achieving High Speed-High Resolution A/D Conversion", IEEE Journal of Solid State Circuits, vol. SC-15, No. 6, Dec. 1980, pp. 1040, 1047-1051.

Primary Examiner—Martin H. Edlow
Attorney, Agent, or Firm—Richard M. Sharkansky; Denis G. Maloney; Peter J. Devlin

[57] ABSTRACT

A subsurface Zener diode is provided wherein a semiconductor has formed thereon spaced apart anode and cathode regions of opposite type conductivity, such regions having opposing surface portions, and disposed beneath a surface of such semiconductor a buried region of conductivity type the same as one of such regions, such buried region extending laterally through the spaced apart regions, one of the spaced apart regions having an opposing surface portion thereof formed with a portion which protrudes towards the opposing surface portion of the other one of the spaced apart regions. With such arrangement, an electric field produced between the spaced apart regions becomes concentrated at the protrusion with the result that Zener breakdown occurs repeatedly at the same point in the semiconductor thereby reducing long term drift. Also, a Kelvin buried Zener diode is provided by forming a second laterally spaced anode region with the cathode region disposed between the pair of anode regions. One of the pair of anodes provides the force anode and the other the sense anode. The buried region extends laterally through the pair of anodes and the cathode region. The cathode region is provided with the portion which protrudes towards the force anode of the pair of anode regions and such cathode is elongated along an axis which passes between the pair of force and sense anode regions. The elongated cathode thus improves isolation between the force and sense anodes.

5 Claims, 4 Drawing Figures

INTEGRATED CIRCUIT ZENER DIODE

BACKGROUND OF THE INVENTION

This invention relates generally to integrated circuit Zener diodes and more particularly to integrated circuit Zener diodes having subsurface or "buried" breakdown junctions.

As is known in the art, one type of semiconductor voltage reference device is a so-called Zener or avalanche diode. In one type of such diode, a p-type conductivity base region is diffused through a surface of an n-type conductivity epitaxial layer which itself is formed on a p-type conductivity silicon wafer. Subsequently, an n-type conductivity emitter region is then diffused within the base region through the same surface. A p-n junction is thus formed between the base-emitter regions, and when a proper voltage is applied across the junction, the junction breaks down to establish the reference or Zener voltage. Unfortunately, this junction breakdown occurs along the surface of the silicon and, therefore, the precise breakdown or reference voltage is susceptible to surface effects, thereby affecting the accuracy of the reference voltage. Further, in such a surface breakdown device, the breakdown or reference voltage is generally relatively noisy and does not have relatively long-term stability, thereby limiting its effectiveness. Still further, because the surface is especially sensitive to contamination in an oxide layer generally formed on the surface, or the silicon-silicon dioxide interface, short term instabilities and "turn on" drift may result in the reference voltage, thereby adversely affecting the usefulness of such a device in many applications.

Subsurface junction breakdown devices have been described to reduce these effects. One such device has been suggested in a paper entitled "Monolithic-Temperature Stabilized Voltage Reference With 0.5 ppm/°C. Drift" by Robert C. Dobkins, 1966 IEEE International Solid State Circuits Conference, pgs. 108–109. As discussed therein, a deep P+ type conductivity region is diffused into an N-type conductivity silicon wafer, such diffusion then being covered with a standard base diffusion followed by an N+ type conductivity emitter diffusion which covers the deep P+ type conductivity diffusion. Another such diffusion type device is described in U.S. Pat. No. 4,136,349 issued Jan. 23, 1979, inventor Wei K. Tsang, entitled "IC Chip With Buried Zener Diode". In both such vertical diffusion vertical structure type devices, the breakdown occurs in the region where the doping concentration is greatest, that is, across the junction between the P+ and N+ type conductivity regions; hence, beneath the surface of the silicon. However, because of the symmetrical nature of these vertical devices, the Zener breakdown does not occur at one point but rather can occur at or "hunt to" various points along the junction resulting in time related voltage changes and long term noise (i.e. low frequency noise). One Zener diode having its p-type region configured as a "finger" that extends from the larger p-type region into the n-type region to increase the current density through the "finger" and thereby reduce noise is described in connection with FIG. 4 in an article entitled "A Five-Terminal ±15-V Monolithic Voltage Regulator" by William F. Davis, published in the IEEE Journal of Solid State Circuits, Vol. SC-6, No. 6, December 1971, pgs. 366–376. However, such described diode is not a "buried" device and hence is subject to the aforementioned surface effects.

Another type of buried Zener diode includes an implantation layer disposed beneath the surface of the structure and passing laterally through laterally spaced apart, surface diffused, p and n type conductivity regions. Such devices are described in an article entitled "An Ion-Implanted Subsurface Monolithic Zener Diode" by Sik Lui, Robert G. Meyer and Norman Kwan, published in the IEEE Journal of Solid-State Circuits, Vol. SC-14, No. 4, August 1979, pgs. 782–784; and, U.S. Pat. No. 4,079,402 entitled "Zener Diode Incorporating an Ion Implanted Layer Establishing the Breakdown Point Below the Surface" inventors James L. Dunkley and James E. Solomon, issued Mar. 14, 1978. In such implanted buried Zener diodes while the breakdown point for avalanching occurs below the surface and hence away from surface contaminants such as are found in the oxide surface layer, because of the configuration of the p and n type conductivity regions, the actual point of avalanche can vary with time as in the case of the diffusion formed buried zener devices described above.

As is also known in the art, one type of zener diode is a so-called Kelvin zener diode. Such a device has a pair of anodes; one called the force anode or electrode and the other the sense anode or electrode. Such a device is referred to in U.S. Pat. No. 4,313,083 entitled "Temperature Compensated IC Voltage Reference", inventors Barrie Gilbert and Peter R. Holloway, issued Jan. 26, 1982 and U.S. Pat. No. 4,315,209 entitled "Temperature Compensated Voltage Reference Circuit" by James C. Schmoock, issued Feb. 9, 1982 and assigned to the same assignee as the present invention. As is known, the force electrode is used to apply a sufficient voltage potential relative to the cathode potential to break down the Zener junction while the sense electrode is used merely to sense the breakdown voltage.

SUMMARY OF THE INVENTION

In accordance with the present invention, a subsurface Zener diode is provided wherein a semiconductor has formed thereon spaced apart anode and cathode regions of opposite type conductivity, such regions having opposing surface portions, and disposed beneath a surface of such semiconductor a buried region of conductivity type the same as one of such regions, such buried region extending laterally through the spaced apart regions, one of the spaced apart regions having an opposing surface portion thereof formed with a portion which protrudes towards the opposing surface portion of the other one of the spaced apart regions. With such arrangement, an electric field produced between the spaced apart regions becomes concentrated at the protrusion with the result that Zener breakdown occurs repeatedly at the same point in the semiconductor thereby reducing long term drift.

In accordance with an additional feature of the invention, a Kelvin buried Zener diode is provided by forming a second laterally spaced anode region with the cathode region disposed between the pair of anode regions. One of the pair of anodes provides the force anode and the other the sense anode. The buried region extends laterally through the pair of anodes and the cathode region. The cathode region is provided with the portion which protrudes towards the force anode of the pair of anode regions and such cathode is elongated along an axis which passes between the pair of force and sense anode regions. The elongated cathode thus improves isolation between the force and sense anodes.

BRIEF DESCRIPTION OF THE DRAWINGS

The foregoing features of this invention as well as the invention itself may be more fully understood from the following detailed description read together in connection with the accompanying drawings, in which.

DESCRIPTION OF THE PREFERRED EMBODIMENT

Figure 1:
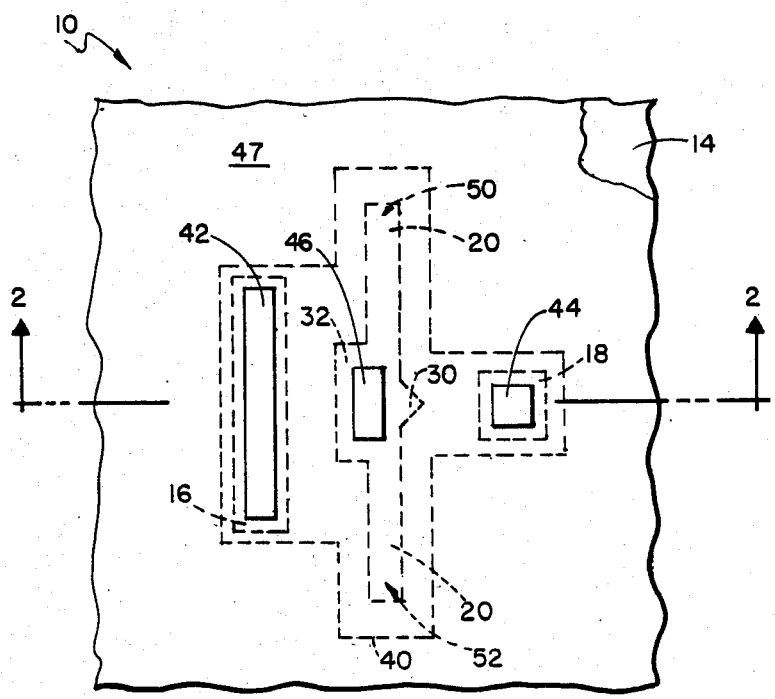
FIG. 1 is a diagrammatical plan view of a Zener diode according to the invention.
Figure 2:
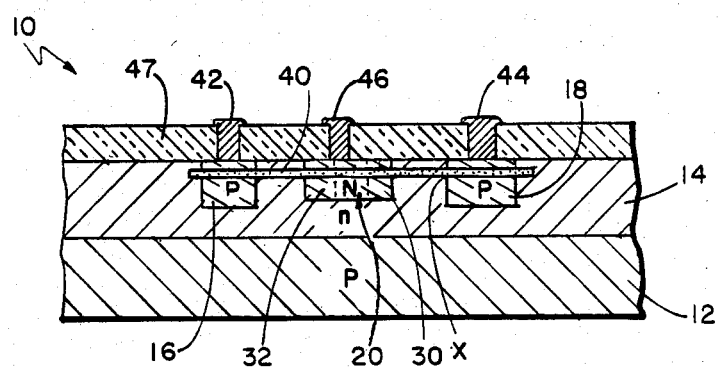
FIG. 2 is a schematic cross-sectional elevation view of the diode of FIG. 1 taken along line 2—2.

Referring now to FIGS. 1 and 2, a Zener diode 10 is shown. Such diode 10 is formed on a p-type conductivity silicon substrate 12, here such substrate 12 having a resistivity of 5–10 ohm-centimeters. An n-type conductivity epitaxial layer 14 is grown on the substrate 10 using conventional epitaxial growth techniques. Here the epitaxial layer 12 has a resistivity of 4 ohm-centimeters (i.e., a doping concentration about $10^{15}$ atoms/cm$^3$). Diffused through selected regions of the surface of the epitaxial layer 14 is a pair of laterally spaced apart p-type conducting regions 16, 18. These p-type conductivity regions 16, 18 are formed by conventional techniques, here by diffusing a suitable dopant, here boron into the pair of selected regions of the surface of the epitaxial layer 14, such selected regions having been exposed by a conventional mask, not shown. The p-type conductivity regions 16, 18 here each have sheet resistance in the order of 200 ohms per square (i.e. a doping concentration in the order of $10^{18}$ atoms per cm$^3$). The depth of the regions 16, 18 is here 2.5 microns. It is also noted that these p-type conductivity regions 16, 18 may be formed simultaneously with p-type diffusions formed in other, isolated regions of the epitaxial layer 12 (not shown) during the process of forming the base diffusion of n-p-n type bipolar transistors (not shown). It is also noted that the surface geometry of each of the diffused regions 16, 18 is each rectangular; diffused region 16 being elongated while region 18 being generally square. As will be seen below, region 16 provides the sense anode of the Zener diode 10 while region 18 provides the force anode of such diode 10.

Subsequently, typically during the formation of the emitter diffusion of the n-p-n transistors (not shown), an n-type conductivity region 20 is diffused into the portion of the surface of the epitaxial layer 14 using conventional masking-diffusion techniques. Here, phosphorous is diffused into the epitaxial layer 14; the concentration of phosphorous atoms in the n-type conductivity region 20 being here in the order of $10^{20}$ atoms per cm$^3$. The depth of the n-type conductivity region 20 is here 2 microns. It is noted that the surface geometry of the n-type conductivity region 20 is here that of an elongated region running generally parallel to region 16 yet extending vertically beyond (i.e., above and below) the top and bottom of both region 16 and region 18. Further, the portion of the right surface of region 20 facing region 18 is provided with a pointed protrusion 30 and the portion of the left surface of region 20 facing region 16 is provided with a protrusion 32, as shown. As will be described in detail hereinafter, the protrusion 30 is provided to concentrate the electric field produced between the p and n regions 18, 20 in response to a Zener voltage applied across these regions 18, 20 to thereby ensure that Zener breakdown repeatedly occurs at the same point, X (FIG. 2).

Subsequent to the formation of the n-type conductivity region 20, a buried layer 40 of p-type conductivity material is ion implanted through a selected portion of the surface of the epitaxial layer 14 using conventional ion implantation-masking techniques. The buried layer 40 extends laterally beneath the upper surface of the epitaxial layer 14 through the p-type conductivity regions 16, 18 and the n-type conductivity region 20, as shown in FIG. 2. Here the buried layer 40 is formed by implanting boron atoms having a dosage of $3 \times 10^{14}$ atoms/cm$^2$ using an energy level in the order of 180 KeV. The peak concentration of the boron atoms is here in the order of $1 \times 10^{19}$ atoms/cm$^3$ and the peak depth is here 4800 Angstroms from the surface of the epitaxial layer 14. It is noted that the peak concentration is greater than the concentration of the p regions 16, 18. The effective width of the buried layer 40 is here in the order of 1500 Angstroms.

Completing the device 10, conventional sense anode electrode 42, force anode electrode 44 and cathode electrode 46 are provided through oxide layer 47 using any conventional technique. When a reverse bias voltage of sufficient voltage level is connected to contacts 44, 46, a strong electric field concentrated at the tip of the protrusion 30 is produced so that current flows between region 20 and region 18 through the buried region 40, and the junction between buried region 40 and region 20 breaks down or avalanches at point X causing a fixed or reference voltage to be produced across electrodes 44, 46. It is noted that the junction breaks down where the doping concentration is greatest and where the electric field concentration is greatest, i.e. at point X, a point below the surface of the epitaxial layer 14. Further, by coupling the electrode 42 to the input of a high impedance amplifier, the breakdown voltage may be sensed by the amplifier. It is noted that since n-type cathode region 20 extends vertically (in FIG. 1) beyond the upper and lower extremes of the p-type regions 16, 18, (that is, the upper and lower extreme ends 50, 52 of cathode region 20 extend beyond regions 16, 18) region 16 has a relatively high degree of electrical isolation from the breakdown current passing between region 20 through region 40 and then to region 18 via point X.

Figure 3:
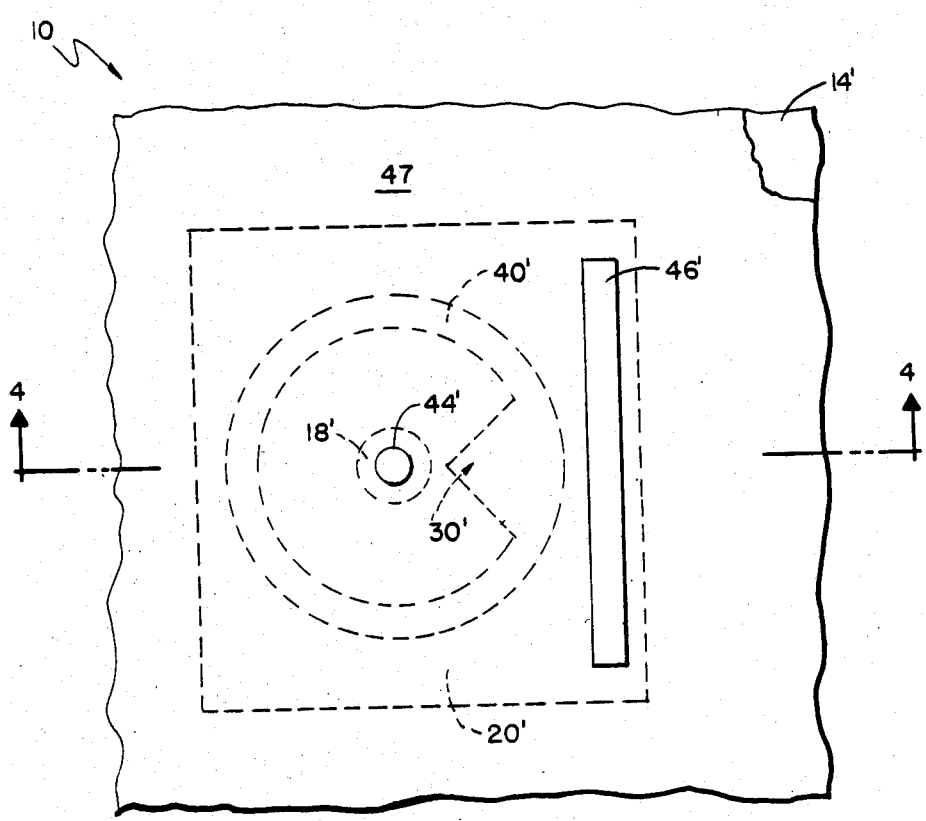
FIG. 3 is a diagrammatical plan view of a Zener diode according to an alternative embodiment of the invention.
Figure 4:
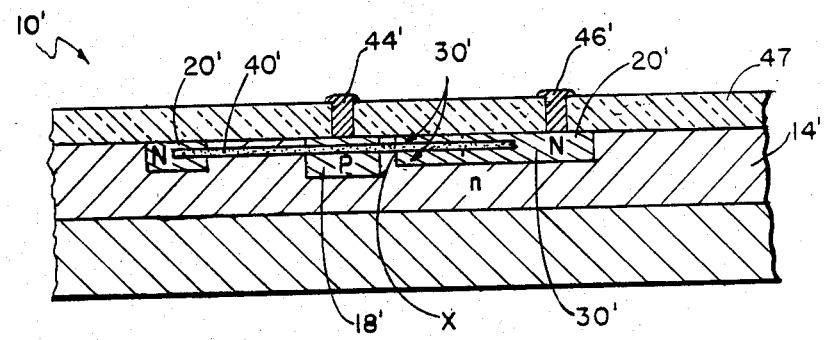
FIG. 4 is a schematic cross-sectional elevation view of the diode of FIG. 3 taken along line 4—4.

Referring to FIGS. 3 and 4, a Zener diode 10' is shown. Here again, an n-type conductivity region 20' and a p-type conductivity region 18' are diffused through the upper surface of the n-type conductivity epitaxial layer 14' and into the upper portion of such epitaxial layer 14'. While the regions 18' and 20' are formed in the same manner and with the same resistivities as the device 10 described in connection with FIGS. 1 and 2, and while n-type conductivity region 20' is spaced apart from p-type conductivity region 18', here p-type conductivity region 18' is encircled by the n-type conductivity region 20'. It is noted that a portion of the inner surface of the n-type conductivity region has a pointed protruding region 30'. More particularly, the region 30' of n-type conductivity region 20' protrudes towards the centrally located p-type conductivity region 18'. Here again, a buried laterally p-type conductivity region 40' is formed by ion implantation, such region 40' extending through the diffused p and n type conductivity regions 18' 20', as shown. Here again, in response to a reverse voltage impressed between the p-type conductivity region 18' and the n-type conductivity region 20' via cathode electrode 46' and anode electrode 44', an electric field is produced which is concentrated at the tip of the protrusion resulting in Zener breakdown or avalanche at a point X; a point at the tip of the protrusion 30' but below the surface because of the buried ion implanted p-type conductivity region 40'.

Having described preferred embodiments of the invention, it is now evident that other embodiments incorporating these concepts may be used. It is felt, therefore, that this invention should not be restricted to disclosed embodiments but, rather, should be limited only by the spirit and scope of the appended claims.

We claim:

1. A subsurface Zener diode comprising:
    (a) a semiconductor;
    (b) spaced apart cathode and first anode regions of opposite type conductivity formed in the semiconductor, such regions having opposing surface portions, one of the spaced apart regions having an opposing surface portion thereof formed with a portion which protrudes towards the opposing surface portion of the other one of the spaced apart regions;
    (c) a second anode region laterally spaced from the cathode and first anode regions, the first and second anode regions being disposed along a first axis, the cathode region being disposed between the first and second anode regions and being elongated along a second axis intersecting the first axis, with ends of such elongated cathode region extending beyond the first and second anode regions; and
    (d) a buried region, having conductivity type the same as the first and second anode regions, disposed beneath a surface of the semiconductor, such buried region extending laterally through the first and second anode regions and cathode region, such buried region being elongated along the second axis and having an end which extends beyond a corresponding one of the ends of the elongated cathode region.

2. The diode recited in claim 1 wherein the protruding portion is pointed.

3. The diode recited in claim 1 wherein the first anode region provides a force anode and the second anode region provides a sense anode for such diode.

4. The diode recited in claim 1 wherein said second axis is disposed substantially perpendicular to said first axis.

5. In combination:
    (a) a semiconductor;
    (b) a pair of laterally spaced apart anode regions formed in the semiconductor, such pair of anode regions having a first conductivity type and being disposed along a first axis;
    (c) a cathode region formed in the semiconductor and disposed between the pair of anode regions, the cathode region having a second conductivity type opposite the first conductivity type, the cathode being elongated along a second axis intersecting the first axis, with an end of such elongated cathode region extending beyond the pair of anode regions; and
    (d) a buried region, having the first conductivity type, disposed beneath a surface of the semiconductor and extending laterally through the cathode and pair of anode regions, said buried region being elongated along the second axis and having an end extending beyond the end of the elongated cathode region.

* * * * *